(12) United States Patent
Verma et al.

(10) Patent No.: US 7,432,599 B2
(45) Date of Patent: Oct. 7, 2008

(54) MEMORY MODULE HAVING INTERCONNECTED AND STACKED INTEGRATED CIRCUITS

(75) Inventors: Vani Verma, Sunnyvale, CA (US); Khushrav S. Chhor, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 345 days.

(21) Appl. No.: 11/326,074

(22) Filed: Jan. 5, 2006

(65) Prior Publication Data

US 2006/0118927 A1 Jun. 8, 2006

Related U.S. Application Data

(62) Division of application No. 10/793,407, filed on Mar. 4, 2004, now Pat. No. 7,005,730, which is a division of application No. 10/080,036, filed on Feb. 19, 2002, now Pat. No. 6,731,011.

(51) Int. Cl.
| | |
|---|---|
| H01L 23/52 | (2006.01) |
| H01L 23/48 | (2006.01) |
| H01L 29/40 | (2006.01) |
| H01L 27/146 | (2006.01) |
| H01L 27/148 | (2006.01) |
| H01L 21/50 | (2006.01) |
| H01L 21/48 | (2006.01) |
| H01L 21/44 | (2006.01) |

(52) U.S. Cl. .................. 257/777; 257/685; 257/686; 257/E27.137; 257/E27.144; 257/E27.161; 438/109; 438/107; 438/108

(58) Field of Classification Search ............ 257/777, 257/685, 686, E27.137, E27.144, E27.161; 438/109, 107, 108

See application file for complete search history.

(56) References Cited

U.S. PATENT DOCUMENTS

3,414,892 A 12/1968 McCormack et al.

(Continued)

FOREIGN PATENT DOCUMENTS

EP 0 073 486 3/1983

(Continued)

OTHER PUBLICATIONS

Akasaka, "Three-dimensional integrated circuit: technology and application prospect," Microelectronics Journal, vol. 20, Nos. 1-2, 1989, pp. 105-112.

(Continued)

*Primary Examiner*—Luan Thai
(74) *Attorney, Agent, or Firm*—Vierra Magen Marcus & DeNiro LLP

(57) ABSTRACT

A multi-chip memory module may be formed including two or more stacked integrated circuits mounted to a substrate or lead frame structure. The memory module may include means to couple one or more of the stacked integrated circuits to edge conductors in a memory card package configuration. Such means may include the capability to utilize bonding pads on all four sides of an integrated circuit. A lead frame structure may be divided into first and second portions. The first portion may be adapted to receive the stacked integrated circuits and the second portion may include a plurality of conductors. The first portion may also be adapted to couple at least one of the integrated circuits to power and ground conductors on the second portion. In one embodiment, the first portion may include the lead frame paddle and a conductive ring. In another embodiment, the first portion may include first and second coplanar elements.

11 Claims, 8 Drawing Sheets

U.S. PATENT DOCUMENTS

| | | | |
|---|---|---|---|
| 3,432,827 A | 3/1969 | Sarno | |
| 4,489,478 A | 12/1984 | Sakurai | |
| 4,500,905 A | 2/1985 | Shibata | |
| 4,535,424 A | 8/1985 | Reid | |
| 4,630,096 A | 12/1986 | Drye et al. | |
| 4,672,577 A | 6/1987 | Hirose et al. | |
| 4,710,798 A | 12/1987 | Marcantonio | |
| 4,811,082 A | 3/1989 | Jacobs et al. | |
| 5,001,539 A | 3/1991 | Inoue et al. | |
| 5,089,862 A | 2/1992 | Warner, Jr. et al. | |
| 5,160,987 A | 11/1992 | Pricer et al. | |
| 5,191,405 A | 3/1993 | Tomita et al. | |
| 5,202,754 A | 4/1993 | Bertin et al. | |
| 5,221,642 A | 6/1993 | Burns | |
| 5,227,338 A | 7/1993 | Kryzaniwsky | |
| 5,236,117 A | 8/1993 | Roane et al. | |
| 5,266,912 A | 11/1993 | Kledzik | |
| 5,279,029 A | 1/1994 | Burns | |
| 5,283,468 A | 2/1994 | Kondo et al. | |
| 5,367,766 A | 11/1994 | Burns et al. | |
| 5,369,056 A | 11/1994 | Burns et al. | |
| 5,369,058 A | 11/1994 | Burns et al. | |
| 5,371,866 A | 12/1994 | Cady | |
| 5,377,077 A | 12/1994 | Burns | |
| 5,398,200 A | 3/1995 | Mazuré et al. | |
| 5,420,751 A | 5/1995 | Burns | |
| 5,422,435 A | 6/1995 | Takiar et al. | |
| 5,426,566 A | 6/1995 | Beilstein, Jr. et al. | |
| 5,434,745 A | 7/1995 | Shokrgozar et al. | |
| 5,446,620 A | 8/1995 | Burns et al. | |
| 5,448,450 A | 9/1995 | Burns | |
| 5,453,952 A | 9/1995 | Okudaira et al. | |
| 5,455,445 A | 10/1995 | Kurtz et al. | |
| 5,455,740 A | 10/1995 | Burns | |
| 5,468,997 A | 11/1995 | Imai et al. | |
| 5,479,318 A | 12/1995 | Burns | |
| 5,481,090 A | 1/1996 | Senock et al. | |
| 5,481,133 A | 1/1996 | Hsu | |
| 5,484,959 A | 1/1996 | Burns | |
| 5,493,476 A | 2/1996 | Burns | |
| 5,495,398 A | 2/1996 | Takiar et al. | |
| 5,498,906 A | 3/1996 | Roane et al. | |
| 5,499,160 A | 3/1996 | Burns | |
| 5,502,289 A | 3/1996 | Takiar et al. | |
| 5,523,622 A | 6/1996 | Harada et al. | |
| 5,523,628 A | 6/1996 | Williams et al. | |
| 5,528,075 A | 6/1996 | Burns | |
| 5,543,664 A | 8/1996 | Burns | |
| 5,550,711 A | 8/1996 | Burns et al. | |
| 5,552,963 A | 9/1996 | Burns | |
| 5,561,591 A | 10/1996 | Burns | |
| 5,561,622 A | 10/1996 | Bertin et al. | |
| 5,566,051 A | 10/1996 | Burns | |
| 5,572,065 A | 11/1996 | Burns | |
| 5,581,121 A | 12/1996 | Burns et al. | |
| 5,581,498 A | 12/1996 | Ludwig et al. | |
| 5,585,668 A | 12/1996 | Burns | |
| 5,585,675 A | 12/1996 | Knopf | |
| 5,586,009 A | 12/1996 | Burns | |
| 5,588,205 A | 12/1996 | Roane | |
| 5,592,364 A | 1/1997 | Roane | |
| 5,605,592 A | 2/1997 | Burns | |
| 5,612,570 A | 3/1997 | Eide et al. | |
| 5,615,475 A | 4/1997 | Burns | |
| 5,631,193 A | 5/1997 | Burns | |
| 5,644,161 A | 7/1997 | Burns | |
| 5,654,220 A | 8/1997 | Leedy | |
| 5,654,877 A | 8/1997 | Burns | |
| 5,693,552 A | 12/1997 | Hsu | |
| 5,696,031 A | 12/1997 | Wark | |
| 5,702,985 A | 12/1997 | Burns | |
| 5,703,747 A | 12/1997 | Voldman et al. | |
| 5,745,407 A | 4/1998 | Levy et al. | |
| 5,778,522 A | 7/1998 | Burns | |
| 5,780,925 A | 7/1998 | Cipolla et al. | |
| 5,781,031 A | 7/1998 | Bertin et al. | |
| 5,783,464 A | 7/1998 | Burns | |
| 5,796,164 A | 8/1998 | McGraw et al. | |
| 5,801,437 A | 9/1998 | Burns | |
| 5,804,870 A | 9/1998 | Burns | |
| 5,828,125 A | 10/1998 | Burns | |
| 5,843,807 A | 12/1998 | Burns | |
| 5,864,175 A | 1/1999 | Burns | |
| 5,895,232 A | 4/1999 | Burns | |
| RE36,229 E | 6/1999 | Cady | |
| 5,915,167 A | 6/1999 | Leedy | |
| 5,945,732 A | 8/1999 | Burns | |
| 5,960,539 A | 10/1999 | Burns | |
| 5,969,380 A | 10/1999 | Seyyedy | |
| 5,973,951 A | 10/1999 | Bechtolsheim et al. | |
| 5,976,953 A | 11/1999 | Zavracky et al. | |
| 5,978,227 A | 11/1999 | Burns | |
| 5,985,693 A | 11/1999 | Leedy | |
| 6,025,642 A | 2/2000 | Burns | |
| 6,034,882 A | 3/2000 | Johnson et al. | |
| 6,049,123 A | 4/2000 | Burns | |
| 6,057,598 A | 5/2000 | Payne et al. | |
| 6,072,234 A | 6/2000 | Camien et al. | |
| 6,085,412 A | 7/2000 | Iwasaki | |
| 6,087,722 A | 7/2000 | Lee et al. | |
| 6,108,730 A | 8/2000 | Dell et al. | |
| 6,133,640 A | 10/2000 | Leedy | |
| 6,168,970 B1 | 1/2001 | Burns | |
| 6,185,122 B1 | 2/2001 | Johnson et al. | |
| 6,190,939 B1 | 2/2001 | Burns | |
| 6,194,247 B1 | 2/2001 | Burns et al. | |
| 6,197,641 B1 | 3/2001 | Hergenrother et al. | |
| 6,205,654 B1 | 3/2001 | Burns | |
| 6,208,545 B1 | 3/2001 | Leedy | |
| 6,252,305 B1 | 6/2001 | Lin et al. | |
| 6,252,791 B1 | 6/2001 | Wallace et al. | |
| 6,258,626 B1 | 7/2001 | Wang et al. | |
| 6,274,930 B1 | 8/2001 | Vaiyapuri et al. | |
| 6,278,181 B1 | 8/2001 | Maley | |
| 6,281,042 B1 | 8/2001 | Ahn et al. | |
| 6,282,210 B1 | 8/2001 | Rapport et al. | |
| 6,288,907 B1 | 9/2001 | Burns | |
| 6,291,858 B1 | 9/2001 | Ma et al. | |
| 6,307,257 B1 | 10/2001 | Huang et al. | |
| 6,310,392 B1 | 10/2001 | Burns | |
| 6,314,013 B1 | 11/2001 | Ahn et al. | |
| 6,322,903 B1 | 11/2001 | Siniaguine et al. | |
| 6,337,521 B1 | 1/2002 | Masuda | |
| 6,351,028 B1 | 2/2002 | Akram | |
| 6,353,265 B1 | 3/2002 | Michii | |
| 6,355,501 B1 | 3/2002 | Fung et al. | |
| 6,515,359 B1 | 2/2003 | Corisis et al. | |
| 6,531,773 B2 | 3/2003 | Nishizawa et al. | |
| 6,583,512 B2 | 6/2003 | Nakaoka et al. | |
| 6,686,663 B2 * | 2/2004 | Masuda et al. | 257/777 |
| 2001/0033030 A1 | 10/2001 | Leedy | |
| 2001/0054759 A1 | 12/2001 | Nishiura | |
| 2002/0024146 A1 | 2/2002 | Furusawa | |
| 2002/0027275 A1 | 3/2002 | Fujimoto et al. | |
| 2002/0030262 A1 | 3/2002 | Akram | |
| 2002/0030263 A1 | 3/2002 | Akram | |

FOREIGN PATENT DOCUMENTS

| | | |
|---|---|---|
| EP | 0 387 834 | 9/1990 |
| EP | 0 395 886 | 11/1990 |
| EP | 0 516 866 | 12/1992 |
| EP | 0 606 653 | 7/1994 |
| EP | 0 644 548 | 3/1995 |

| | | |
|---|---|---|
| EP | 0 800 137 | 10/1997 |
| JP | 60-22352 | 2/1985 |
| JP | 61-222216 | 10/1986 |
| JP | 63-52463 | 3/1988 |
| WO | 94/26083 | 11/1994 |

OTHER PUBLICATIONS

Sakamoto, "Architecture des Circuits à Trois Dimensions," Bulletin of the Electrotechnical Laboratory, vol. 51, No. 1, 1987, pp. 16-29.
Akasaka, "Three-Dimensional IC Trends," Proceedings of the IEEE, vol. 74, No. 12, 1986, pp. 1703-1714.
Pein et al., "Performance of the 3-D PENCIL Flash EPROM Cell and Memory Array," IEEE Transactions on Electron Devices, vol. 42, No. 11, 1995, pp. 1982-1991.
Jokerst et al., "Manufacturable Multi-Material Integration: Compound Semiconductor Devices Bonded to Silicon Circuitry," SPIE vol. 2524, 1995, pp. 152-163.
Camperi-Ginestet et al., "Vertical Electrical Interconnection of Compound Semiconductor Thin-Film Devices to Underlying Silicon Circuitry," IEEE Photonics Technology Letters, vol. 4, No. 9, 1992, pp. 1003-1006.
Lomatch et al., "Multilayered Josephson junction logic and memory devices," SPIE vol. 2157, 1994, Abstract Only, 2 pgs.
Lu, "Advanced cell structures for dynamic RAMs," IEEE Circuits and Devices, vol. 5, No. 1, 1989, Abstract Only, 2 pgs.
Sakamoto, "Architecture of three dimensional devices," Bulletin of the Electrotechnical Laboratory, vol. 51, No. 1, 1987, Abstract Only, 2 pgs.
"Wide application of low-cost associative processing seen," Electronic Engineering Times, 1996, 6 pgs.
"Interconnects & Packaging," Electronic Engineering Times, 1996, 8 pgs.
"Closing in on gigabit DRAMs," Electronic Engineering Times, 1995, 4 pgs.
"Module Pact Pairs Cubic Memory with VisionTek," Semiconductor Industry & Business Survey, vol. 17, No. 15, 1995, 2 pgs.
Flaherty, "Layers of BST materials push toward 1Gbit DRAM," Electronic Times, 1995, 3 pgs.
Santoni, "Technologies Will Pursue Higher DRAM Densities," Electronic News, 1991, 7 pgs.
Weber, "Looking for diverse storage," Electronic Engineering Times, 1994, 7 pgs.
"Special Report: Memory Market Startups, Cubic Memory: 3D Space Savers," Semiconductor Industry & Business Survey, vol. 16, No. 13, 1994, 6 pgs.
Bindra, "Technique boosts 3D memory density," Electronic Engineering Times, 1994, 2 pgs.
Bindra, "Memory packs poised for 3-D use," Electronic Engineering Times, 1992, 4 pgs.
Derman, "MCMs hit the road," Electronic Engineering Times, 1992, 6 pgs.
Bindra, "IEDM ponders the 'gigachip' era," Electronic Engineering Times, 1992, 4 pgs.
"Tech Watch: 1-Gbit DRAM in sight," Electronic World News, 1991, 2 pgs.
Derman, "MCMs meld into systems," Electronic Engineering Times, 1991, 7 pgs.
Brown, "Systems EEs see future in 3-D," Electronic Engineering Times, 1990, 4 pgs.
Hayashi et al., "A New Three Dimensional IC Fabrication Technology, Stacking Thin Film Dual CMOS Layers," © 1991 IEEE, 4 pgs.
Tielert, "Benefits of Vertically Stacked Integrated Circuits for Sequential Logic," © 1996 IEEE, pp. 121-124.
Stern et al., "Design and Evaluation of an Epoxy Three-Dimensional Multichip Module," IEEE Transactions on Components, Packaging, and Manufacturing Technology—Part B, vol. 19, No. 1, 1996, pp. 188-194.
Bertin et al., "Evaluation of a Three-Dimensional Memory Cube System," IEEE Transactions on Components, Hybrids, and Manufacturing Technology, vol. 16, No. 8, 1993, pp. 1006-1011.
Watanabe et al., "Stacked Capacitor Cells for High-density dynamic RAMs," © 1988 IEEE, pp. 600-604.
"Stacked Memory Modules," IBM Technical Disclosure Bulletin, vol. 38, No. 5, 1995, 2 pgs.
"3-D Chip-on-chip Stacking," Semiconductor International, 1991, 1 pg.
Thakur et al., "An Optimal Layer Assignment Algorithm for Minimizing Crosstalk for Three Layer VHV Channel Routing," © 1995 IEEE, pp. 207-210.
Terrill et al., "3D Packaging Technology Overview and Mass Memory Applications," © 1996 IEEE, pp. 347-355.
Sugahara et al., "A Three-Dimensional Static RAM," IEEE Electron Device Letters, vol. EDL7, No. 5, 1986, pp. 327-329.
Tielert, "Benefits of Vertically Stacked Integrated Circuits for Sequential Logic," © 1996 IEEE, pp. 121-124.
Akasaka, "Three-Dimensional IC Trends," © 1986 IEEE, pp. 1703-1714.
Kurokawa et al., "3-D VLSI Technology in Japan and an Example: a Syndrome Decoder for Double Error Correction," Future Generation Computer Systems, vol. 4, No. 2, 1988, pp. 145-155.
Maliniak, "Memory-Chip Stacks Send Density Skyward," Electronic Design, vol. 42, No. 17, 1994, 5 pgs.
Schlaeppi et al., "Submicrosecond Core Memories Using Multiple Coincidence," IRE Transactions on Electronic Computers, 1960, pp. 192-198.
Schlaeppi et al., "Submicrosecond Core Memories Using Multiple Coincidence," 1960 International Solid State Circuits Conference, pp. 54-55.
Lay, "TRW Develops Wireless Multiboard Interconnect System," Electronic Engineering Times, 1984, 1 pg.
Yamazaki et al., "Fabrication Technologies for Dual 4-Kbit Stacked SRAM," © 1986 IEEE, pp. 435-438.
Dipert, "Exotic memories, diverse approaches," EDN Asia, Sep. 2001, pp. 22-33.
"Multi-Chip & Stacked Leadframe Packages," Amkor Technology, Inc., 5 pgs.
"MultiMedia Card (MMC)," Amkor Technology, Inc., 4 pgs.
"Four Semiconductor Manufacturers Agree to Unified Specifications for Stacked Chip Scale Packages," Jul. 5, 1999 Mitsubishi Semiconductors Press Release, 3 pgs.
"Samsung Develops 512Mb Flash Memory," Jan. 21, 2001 Digital Photography Review, 2 pgs.
Data Sheet for MMC Multi Media Card, Siliconware Precision Industries Co., Ltd.
"Toshiba Develops 8Mb Low-Power SRAM Device and Industry's First 8Mb SRAM/64Mb NOR Flash Stacked MCP Memory Device," Mar. 9, 2000 Toshiba Press Release, 3 pgs.
Edwards, "Hitachi moves to multi-chip to get EEPROM on top," Jul. 18, 2001 Electronic Times, 3 pgs.

* cited by examiner

MEMORY MODULE HAVING INTERCONNECTED AND STACKED INTEGRATED CIRCUITS

CROSS REFERENCE TO RELATED APPLICATIONS

This application is a divisional application from prior application Ser. No. 10/793,407 filed Mar. 4, 2004 now U.S. Pat. No. 7,005,730 which was a divisional application from prior application Ser. No. 10/080,036 filed Feb. 19, 2002 now U.S. Pat. No. 6,731,011.

This application is related to commonly assigned:

U.S. Pat. Nos. 6,034,882 and 6,185,122, both titled "Vertically Stacked Field Programmable Nonvolatile Memory and Method of Fabrication", by inventor Mark G. Johnson et al.;

U.S. patent application Ser. No. 09/814,727 and Ser. No. 09/560,626, both titled "Three Dimensional Memory Array and Method of Fabrication", by Johan Knall et al, filed Apr. 21, 2001 and Apr. 28, 2000, respectively;

U.S. patent application Ser. No. 09/928,536 titled "Vertically Stacked, Field Programmable, Nonvolatile-Memory and Method of Fabrication" by Mark G. Johnson, filed Aug. 13, 2001;

U.S. patent application Ser. No. 10/010,643, titled "Insulator Programmed Mask ROM Memory Cells for a 3-Dimensional Memory Array", by Mark G. Johnson, filed Nov. 5, 2001;

all of which are incorporated herein by reference.

BACKGROUND OF THE INVENTION

1. Field of the Invention

This invention relates to integrated circuit packaging and, more particularly, to a memory subsystem encapsulated in a molded resin, where the subsystem comprises integrated circuits that are interconnected and stacked, preferably, upon a first portion (i.e., paddle) of a lead frame. The second portion (i.e., conductors) of the lead frame extend toward the first portion and receive bonding wires that are coupled to respective bonding pads on the stacked integrated circuits. As such, the second portion of the memory subsystem may form edge connectors configured as substantially planar pads extending along an outer surface of the encapsulated subsystem. The exposed surface of the edge connectors may frictionally contact an outer surface of corresponding pads arranged within a receptor of an electronic system, such that the receptor may thereby receive the memory subsystem.

2. Description of the Related Art

The following descriptions and examples are not admitted to be prior art by virtue of their inclusion within this section.

An electronic system is typically known as any device that may receive, transmit, and process electronic signals. Examples of popular electronic systems may include the personal computer, personal digital assistant (PDA), digital camera, or any other electronic-based appliance used in a consumer setting. A commonality among all electronic systems may be that they employ an interconnection of one or more circuits. Depending on the amount of integration, the circuits may be formed on a single monolithic substrate, often a silicon substrate, henceforth referred to as an integrated circuit.

Typical electronic systems may include one or more integrated circuits connected to each other by conductors. Thus, circuits within one integrated circuit may communicate with circuits within another integrated circuit. In order to protect the functionality of the circuits, each integrated circuit may be placed in a package to seal the integrated circuit from the environment. In addition to protecting an integrated circuit, a package may also help to distribute signals sent to and from the integrated circuit and, depending on the materials used, the package may also help dissipate heat that occurs during operation of the integrated circuit.

There may be numerous types of integrated circuit packages, though typically packages may be categorized as either ceramic packages or plastic packages. Ceramic packages may surround the encased integrated circuit with air, while plastic packages generally employ a resin that may fill the space between the integrated circuit and the surrounding package. Plastic packages may be less expensive than ceramic packages. Regardless of whether a package may be ceramic or plastic, there may be numerous package configurations and lead arrangements extending from the package. The package leads may serve to communicate signals between an integrated circuit and, thus, may be electrically connected to corresponding bonding pads on the integrated circuit in one of possibly three ways: wire bonding, Tape-Automated Bonding (TAB), or flip-chip attachment. Each arrangement is relatively well known and may be used in different applications based on cost constraints and the density of the integrated circuit bonding pads.

After a package may be formed around the integrated circuit, the matter of connecting one packaged integrated circuit to another packaged integrated circuit generally involves a printed circuit board or "card." A card is a rigid, substantially planar backbone element that employs one or more layers of trace conductors separated by a dielectric layer. The trace conductors may extend along one or more of layers of the card, and may connect leads of one integrated circuit to leads of another integrated circuit through vias. The printed circuit board may have plated-through holes (or vias) to accommodate downward extending leads of a packaged integrated circuit, or may simply have a square or rectangular pad on which planar surfaces of the packaged integrated circuit leads may be surface-mounted. The card may serve not only to interconnect signals between integrated circuits, but may also provide mechanical support for multiple integrated circuits arranged within a chassis of an electronic system. The card may thereby suffice to arrange the bonded integrated circuits a spaced distance from each other within the confines of the chassis.

In addition, numerous ways may exist in which to configure a card and the integrated circuits bonded to that card. For example, FIG. 1 illustrates a memory card 10 with edge connectors 12. Edge connectors 12 may be arranged on the backside surface of card 10 near a forward-leading edge 14 of card 10. According to such an example, edge 14 may be inserted through slot 16 extending through chassis 18 of an electronic system 20.

Therefore, memory card 10 may be inserted into receptor 22, which may be electrically connected to, for example, another card 24. Like card 10, card 24 may also contain printed conductors and one or more integrated circuits 26 interconnected with each other on a surface of card 24. However, in contrast to card 24, card 10 may include a specific purpose that may be universally applied to an electronic system, and may be obtainable from numerous vendors in the memory technology sector. Thus, card 10 may be a memory card, and may utilize edge connectors 12 that may frictionally engage conductive elements 28 arranged within receptor 22. In this manner, edge connectors 12 may be designed to releasably insert into receptor 22.

Card 10 is illustrated in partial breakaway in FIG. 2. Card 10 may have one or more interconnected integrated circuits 30 which may also be connected to edge conductors 12 by trace conductors 32. A memory card preferably uses a form of memory array. A popular memory array may involve an array of non-volatile storage elements. The non-volatile storage elements may be configured on a single monolithic silicon substrate to form a non-volatile memory integrated circuit 30b. Along with circuit 30b may be memory controller 30a. In addition to integrated circuits 30, card 10 may also have mounted thereon discrete devices, such as decoupling or de-bounce capacitors 34. Capacitors 34 may serve to minimize transient noise applied to trace conductors 32.

In addition to the printed circuit board (or card) on which memory 30b, memory controller 30a, and capacitors 34 may be secured, card 10 may also include covering 36. Covering 36 may surround and protect the integrated circuits and capacitors mounted on card 10. Furthermore, tab or switch 38 may be formed as part of covering 36, such that when moved, switch 38 may prevent a write operation to the memory integrated circuit. Switch 38 thereby suffices to "write protect" memory card 10. If switch 38 is activated, any signal sent to edge conductors 12 to be written onto the storage elements of memory 30b may be prevented from being stored. Activation may occur simply by moving switch 38 from one position to another along the sidewall surface of card 10.

The memory card 10 shown in the configuration of FIGS. 1 and 2 gained popularity, for example, during the advent of flash memory. Flash memory may be easily erased and reprogrammed. Once reprogrammed, the data within the flash memory is said to be non-volatile and may remain until erased or again reprogrammed. Thus, card 10 may be erased and reprogrammed while in receptor 22 provided, of course, that switch 38 is not in the write protect position. Once programmed, any data stored within non-volatile memory 30b of card 10 may remain, thereby allowing card 10 to be removed and reinserted at a later time whenever that data may be needed—similar to a floppy disk.

At present there are numerous types of memory cards having the aforesaid characteristics. Popular such memory cards include: Sony's memory stick, compact flash, smart media, PC cards, flash path, multimedia cards and secure digital. All of the well-known memory cards typically include both a memory controller and non-volatile memory mounted on the card itself, or the controller may form a part of the memory interface, all of which may be interconnected to the edge connectors. As such, memory modules that include two or more die, such as a controller die and storage element, may also be called multi-chip modules (MCM).

The most common type of MCM may be the side-by-side MCM, which may mount two integrated circuits (or two die) next to each other on the top surface of a package substrate. Interconnections between integrated circuits and conductive traces on the substrate may typically be achieved by wire bonding. However, the side-by-side MCM may suffer from low package efficiency since the area of the package substrate generally increases with an increase in the number of integrated circuits mounted on the package substrate. Such an increase in package size may also increase the overall cost of the package.

Thus, a multi-chip module (MCM) may be created in which one or more die, for example, memory controller and memory array chip, may be stacked upon a package substrate to increase package efficiency. U.S. Pat. No. 6,252,305 to Lin et al. describes such a multi-chip module having a stacked chip arrangement. FIG. 3 discloses a multi-chip module 31 comprising four chips 21, 23, 25, 27 stacked upon each other and mounted to a substrate 29. Thus, the MCM comprises at least two semiconductor chips, such that each chip has a row of bonding pads formed on the active surface of the chip. However, the row of bonding pads may be disposed along only one side edge of the chip. The semiconductor chips are mounted to a substrate in a stacking arrangement, such that an upper chip is bonded to the active surface of a lower chip in such a manner that no portion of the upper chip interferes (or covers) each bond pad of the lower chip. Such an arrangement may permit wire bonding of the stacked chips to the underlying trace conductors 33 on the surface of package substrate 29.

In stacking arrangements as described above, it appears necessary to include active bonding pads arranged on only one side of an integrated circuit. Arranged on the opposing sides of the integrated circuit may be dummy bonding pads that have bond capability, yet may not be connected to internal circuitry of the integrated circuit. As such, only one side of an integrated circuit may include active bonding pads, and the other three sides of the integrated circuit may have dummy bonding pads. The dummy bonding pads may be necessary only for mechanical and assembly reasons, and may not serve to communicate with internal circuitry of the integrated circuit. Thus, the individual chips having bonding pads disposed along only one side of the chip, as described in the above prior art, may each be wire bonded to a package substrate on opposing sides of the substrate. Therefore, mounting a multi-chip module in a substrate package may allow each chip in the stack to be wire bonded to the surface of the substrate along all four sides of the substrate. However, this bonding arrangement may not be possible in other memory packaging configurations. For example, the above bonding arrangement may not be possible in memory card configurations, since memory card edge connectors (i.e. bonding pads) may be arranged along only one side of the card.

Therefore, it may be desirable to manufacture a multi-chip memory subsystem using the conventional edge connector arrangement employed by memory cards. The desired memory subsystem may, however, avoid using a printed circuit board or card for electrical routing or as a backbone for mechanical stability. The desired memory subsystem may be classified as a memory module made of less expensive materials and in less time than conventional memory cards. The desired memory subsystem may avoid the most expensive component of a memory card by eliminating the cost and lead time needed to form package material about an integrated circuit, form printed conductors upon and within a card, and form the connection between leads of the integrated circuit and printed conductors upon (or within) the card. In addition, the desired memory subsystem may integrate a memory and controller die in such a manner as to reduce the overall cost of the memory subsystem.

SUMMARY OF THE INVENTION

The problems outlined above may be in large part solved by a multi-chip memory subsystem, having the dimensions and characteristics of a conventional memory card, without the time and expense in making such a card.

In one aspect of the invention, the present memory card provides a multi-chip memory subsystem including two or more stacked integrated circuits encased by a molded resin having an outer surface on which the second end of each of the plurality of conductors terminates in a single row near an edge of the memory module. In a preferred embodiment, the stacked integrated circuits comprise a memory chip and a controller. Most preferably, the memory is a three-dimensional memory of the type described in the patents and applications listed in the cross-reference to related applications (paragraph one of this specification).

In another aspect of the invention, the present memory card provides a multi-chip memory subsystem including two or more stacked integrated circuits bonded, according to one embodiment, to a lead frame structure. The multi-chip memory subsystem preferably includes a means to couple one or more stacked integrated circuits to edge connectors in a memory card package with the capability to utilize bonding pads on all four sides of the integrated circuits.

The memory subsystem may include a stacked pair of integrated circuits, which may include storage elements and a memory controller, and any capacitive elements needed to decouple signal lines on a single monolithic substrate. The first step in processing the memory module may entail bonding conductors to bonding pads of the stacked integrated circuit similar to techniques used to bond package leads to the integrated circuit when forming a packaged integrated circuit. However, instead of merely packaging the integrated circuit, the bonded conductors may be encased within an encapsulate to form a memory module with an outer dimension similar to those of conventional memory cards. The edge connectors attributable to a memory card may be arranged in similar fashion on the memory module, where the conductors may serve not only to connect to the integrated circuit bonding pads, but also a portion of each conductor may be presented as a substantially planar surface (i.e., pad) forming a corresponding edge connector.

The memory module may include a plurality of conductors for coupling circuit elements within the memory module to circuit elements within an electronic device through corresponding conductors arranged in a receptor of the electronic device. The conductors may transmit electrical signals to and from the circuit elements via corresponding edge connectors. The conductors may also be formed having opposed first and second ends. The memory module may also include one or more integrated circuits. In this manner, the first end of the conductors may be coupled to bonding pads on one or more of the integrated circuits.

Furthermore, the second end of the conductors may be shaped similar to edge connectors of a conventional memory card. Unlike conventional integrated circuit packaging, however, the present plurality of conductors may extend in only one direction from the integrated circuit. The memory module may further include a molded resin encasing the stacked integrated circuits, and having an outer surface on which the second end of the conductors may terminate in a single row near an edge of the memory module. The row of second ends may extend flush with, or possibly extend slightly above or below, the outer surface of the molded memory module. As such, when inserted into a receptor of an electronic device, the second ends (i.e. edge connectors) may be retained only in surface contact with a corresponding planar conductive surface within the receptor. Therefore, the second ends may have a planar outer surface that releasibly connects with a corresponding planar outer surface of conductive elements within a receptor. In this manner, the memory module may be inserted and removed (i.e., released) from the receptor. During such time that the memory module may be inserted into the receptor, the row of second ends may maintain electrical communication with the conductive elements of the receptor, in order to facilitate communication between the memory module and the electronic system.

According to one embodiment, a memory module may be formed on a lead frame structure, such that the structure of the lead frame may be divided into first and second portions. The first portion of the lead frame may be adapted to receive a first integrated circuit. In addition, a second integrated circuit may be stacked upon and coupled to the first integrated circuit. For example, the first integrated circuit may be an array of storage elements (i.e. memory) while the second integrated circuit may be a controller for the memory. Alternatively, a memory die may be stacked upon a controller die, or any other combination of two or more integrated circuits may also be used. In this manner, stacking integrated circuits on a portion of a lead frame, instead of placing them side by side on a package substrate, may reduce the overall size, complexity, and/or cost of the memory module.

The second portion of the lead frame may include a plurality of conductors having opposed first and second ends. A first set of the plurality of conductors may be laterally spaced from the first portion of the lead frame. A first set of wires may extend between bonding pads of the stacked integrated circuits and the first end of the first set of conductors (i.e. conductive "bonding fingers" of the first set of conductors). The second end of each of the plurality of conductors may be adapted for frictional engagement with conductive elements arranged within a receptor of an electronic device. During times when the edge of the memory module may be slid into the receptor, the second end of the first set of conductors (i.e. edge connectors) may maintain an electrical connection with the conductive elements, or corresponding edge connectors, within the receptor.

In addition, a second set of wires, which transmit power and ground signals, may extend between the stacked integrated circuits and the first portion of the lead frame. The first portion of the lead frame may be laterally coupled to a second set of the plurality of conductors. In this manner, the first portion may be adapted to couple at least one of the stacked integrated circuits to power and ground connections on the second set of conductors. As such, the first portion may include power and ground planar elements. The power element may extend as a conductive ring coplanar with and laterally spaced from the ground element, such that the ground element may be the paddle portion of the lead frame. Furthermore, a first one of the second set of conductors may be adapted to connect the conductive ring to a power signal (or any other signal). Similarly, a second one of the second set of conductors may be adapted to connect the ground element to a ground signal (or any other signal). Alternatively, the ground element may be adapted to transmit a power signal and the conductive ring may be adapted to transmit a ground signal. Moreover, the first portion may be adapted to couple any two bonding pads of the plurality of conductors to bonding pads on any side of an integrated circuit.

According to another embodiment of the present invention, a lead frame may be divided into first and second portions. The first portion of the lead frame may be configured to receive a first integrated circuit. A second integrated circuit may also be stacked upon and coupled to the first integrated circuit. For instance, the first integrated circuit may be a memory while the second integrated circuit may be a controller. Alternatively, a memory die may be stacked upon and coupled to a controller die, or any other combination of two or more integrated circuits may also be used to create a stacked configuration. In addition, the first portion of the lead frame may be further separated into first and second coplanar elements.

The second portion of the lead frame may include a plurality of conductors, where a first conductor from among the first set of conductors may extend toward and connect with the first coplanar element of the first portion. Likewise, a second conductor from among the plurality of conductors may extend toward and connect with the second coplanar element of the first portion. In this manner, the first conductor may transmit a power signal to the first coplanar element, while the second conductor may transmit a ground signal to the second coplanar element. Alternatively, the first conductor may transmit a ground signal to the first coplanar element, while the second conductor may transmit a power signal to the second coplanar element. In any case, all other of the first set of conductors, except for the first one and second one, may be spaced from the first portion.

In addition, a lower surface of the first integrated circuit may be bonded to the first portion (i.e. paddle) of the lead frame in such a manner as to bond with at least a portion of each of the first and second coplanar elements (i.e. bifurcated paddle) of the lead frame. The second integrated circuit may be stacked upon and bonded to the upper surface of the first integrated circuit. Furthermore, the first portion of the lead frame may be a conductive plate, such that the first and second coplanar elements of the first portion may be adapted to transmit power and ground signals (or two dissimilar signals). The bifurcated paddle, or first portion, may also be adapted to extend beyond the dimensions of the stacked integrated circuits. Thus, the bifurcated paddle of the lead frame may be adapted to couple two dissimilar signals from the first set of conductors to bonding pads on one or more sides of the integrated circuits.

In each embodiment of the present invention, the first set of the plurality of conductors may extend into an opening created within the lead frame. The conductors, therefore, may form a part of the lead frame used in wire bonding processes. Thus, the first end of one or more of the plurality of conductors may be secured directly to a bonding pad of an integrated circuit using, for example, a wire coupled between the lead frame post, or conductor, and a bonding pad on an integrated circuit. Alternatively, integrated circuits may be placed side-by-side on a laminate-based Ball Grid Array (BGA) package, allowing routing between the two die via metal trace interconnects on the laminate material. Similar to using a lead frame package, the first end of one or more of the first set of conductors may be wire bonded to a bonding pad on an integrated circuit mounted on the BGA package. However, placing die side-by-side, rather than in a stacked configuration, may not solve the real estate reduction objective. Additionally, laminate material chip carriers may be more expensive than metal lead frame based chip carriers by an order of magnitude.

Therefore, a lead frame structure may be used, such that the lead frame post coupled to the bonding pad by a wire bond may be specially designed. The post (or conductor) may extend, for example, in two planes whereby a first plane may be above or coplanar with a first portion (or paddle) on which the integrated circuit may be secured. A second part of the conductor may be configured parallel to and below the first plane, such that the post (or conductor) may extend along the first plane downward at an angle to the second plane. According to one example, the downward angle may be less than ninety degrees, and preferably less than 60 degrees from a horizontal plane. The second part, as well as the angled joinder of the first and second parts may be encompassed entirely within a resin encapsulate. The part of the conductor that occupies the second plane may form the edge connector and, therefore, may be brought flush with the outer surface of the memory module. The part that extends along the first plane may be adapted to receive a wire bond. In this fashion, the conductor or lead frame may suffice not only to convey signals to and from an integrated circuit, but may also be shaped to extend both within the memory module encapsulate material and outside the encapsulate material.

The memory module may be formed using a simple pair of mold housings, such that the integrated circuit purposely avoids having to rest upon any mechanical support other than, for example, a first portion (or "paddle") of a lead frame. The pair of mold housings may thereby form a cavity that surrounds the lead frame-bonded integrated circuit. The pair of mold housings may include an opening, which may allow liquid resin to be inserted into the cavity. The inner walls of the pair of mold housings that form the cavity may be dimensioned according to the standards of a memory card device with associated width, height, and length configuration of a conventional memory card. Thus, the mold cavity may be much larger than the silicon substrate of an un-packaged integrated circuit. The mold cavity may form the memory module by filling the cavity with a flowable encapsulate to surround the lead frame and attached integrated circuits. In this manner, no intervening card or substrate may be necessary to support the integrated circuits, as opposed to conventional designs in which packaged integrated circuits may be mounted on a card, or flip-chip secured to a substrate that may be mounted to a card.

BRIEF DESCRIPTION OF THE DRAWINGS

Other objects and advantages of the invention will become apparent upon reading the following detailed description and upon reference to the accompanying drawings in which.

Figure 1:
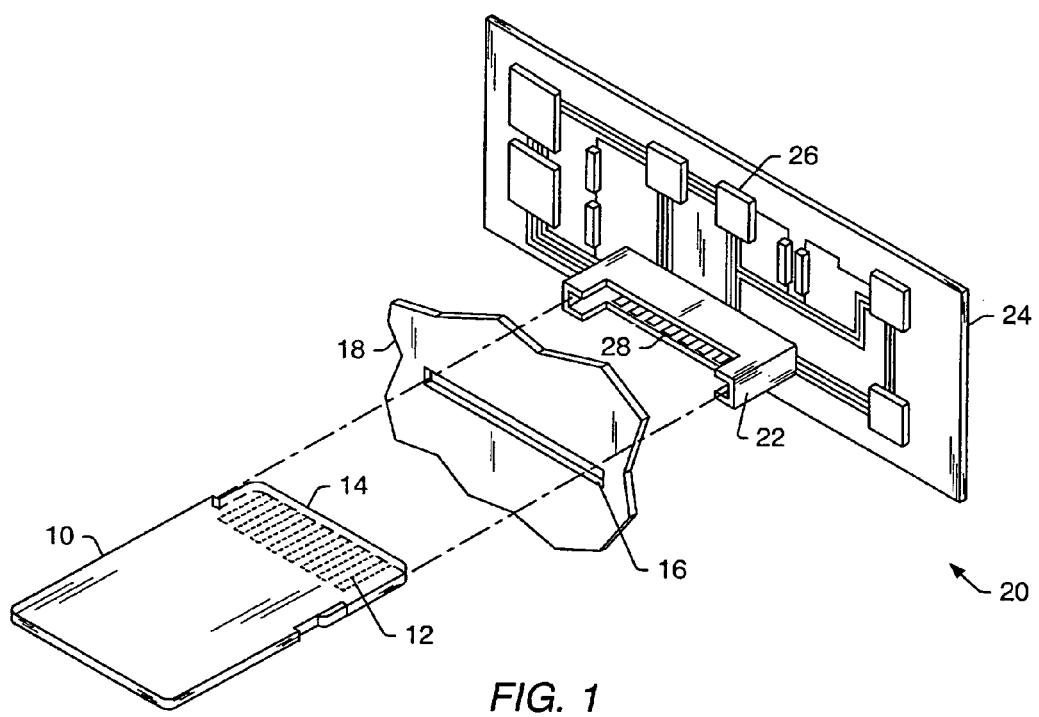
FIG. 1 is a perspective view of a conventional memory card having edge connectors adapted for insertion through a slot of an electronic system, according to one memory card attachment methodology.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Figure 4A:
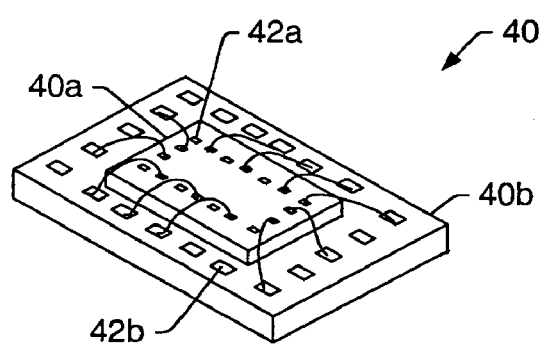
FIG. 4A is an illustration of a wire-bonded, stacked pair of integrated circuits.

Turning now to the drawings, FIG. 4A illustrates the interconnection between two or more integrated circuits using a wire bonding process. In the scope of the present embodiments, the lower or first integrated circuit 40*b* may include a storage element attributable to semiconductor memory devices. Set forth in more detail below, first integrated circuit 40*b* may also include a multi-level array of storage cells as described in the commonly assigned U.S. patent application Ser. No. 09/814,727, or any of the patents or applications set forth in the cross-reference section (paragraph one) of this application. The upper or second integrated circuit 40*a* may include similar circuitry, or may include different technology all together. For example, the second integrated circuit 40*a* may include a controller for the storage element. In such an example, the controller for the semiconductor memory may be bonded to the top surface of the memory using a die attach adhesive. The die attach adhesive may be tape or epoxy based. A wire bonding machine, which may operate much like a sewing machine, may attach individual wires between bonding pads 42 on the active surface of each die, in such a manner as to achieve the required system functionality and communication between the memory, controller, and the outside world. As such, bonding pads 42*a* of integrated circuit 40*a* may be directly attached to bonding pads 42*b* of integrated circuit 40*b* with such a wire bonding process. The wires used in the wire bonding process may typically be aluminum, since aluminum is a good conductor and does not sag like softer materials (for example, gold).

Figure 4B:
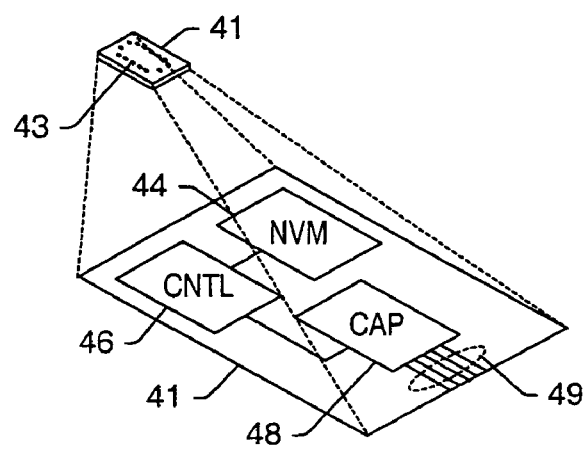
FIG. 4B is a detailed block diagram of one embodiment of an integrated circuit.

FIG. 4B indicates the various components that may be found on a single integrated circuit, in one example. More specifically, integrated circuit 41 may be a single die within multiple dice arranged across a semiconductor wafer. Integrated circuit 41 may represent the culmination of multiple processes applied to a single crystalline silicon base material. Such processes may include implantation, deposition, etching, cleaning, and polishing steps, among others. Integrated circuit 41, however, may not be placed in a package after it is scribe-removed from the wafer. According to one example, integrated circuit 41 may be highly integrated, and may include the various circuits needed to store and recall data. Those circuits may also include an array of memory cells that, according to one example, may be based on non-volatile memory cells 44. The mechanism responsible for directing data to and from memory cells 44 may involve memory controller 46. Memory controller 46 may be arranged on-chip, as in the example depicted in FIG. 4B. Alternatively, memory controller 46 may be arranged off-chip. As shown in FIG. 4A, a memory controller may also be coupled to memory as a separate die (i.e. integrated circuit 40*a* and 40*b*, respectively).

In addition, it may be necessary to maintain data sent to and from memory cells 44 substantially free of noise. Therefore, decoupling capacitors 48 may be used to maintain a more pristine characteristic of the data sent to and from memory cells 44. As shown in FIG. 4B, decoupling capacitors 48 may be incorporated into an integrated circuit along with memory cells 44 and memory controller 46. On the other hand, decoupling capacitors 48 may be arranged on a separate controller die, as described in reference to FIG. 4A. In any case, conductors 49 may transmit data and control signals, and may extend to bonding pads on an integrated circuit. Thus, in the illustrated example, conductors 49 may terminate at bonding pads 43 of integrated circuit 41.

In one embodiment of the multi-chip module, first integrated circuit 40*b* may include a multi-level array of storage cells (i.e. three-dimensional memory array) as described in any of the patents or applications set forth in the cross-reference section (paragraph one) of this application. Such a three-dimensional memory array may be fabricated on several levels and may have eight levels of storage, in one example. In one embodiment, each level of storage may include a plurality of parallel rail-stacks aligned in a first direction and another plurality of rail-stacks or conductors aligned in a second direction. Such a second direction may be substantially perpendicular to the first direction, thereby forming right angles at the intersections between rail-stacks. A bit may be stored at each of the intersections of the perpendicular rail-stacks, such that memory cells may be defined by the rail-stacks and intermediate layers.

Figure 5:
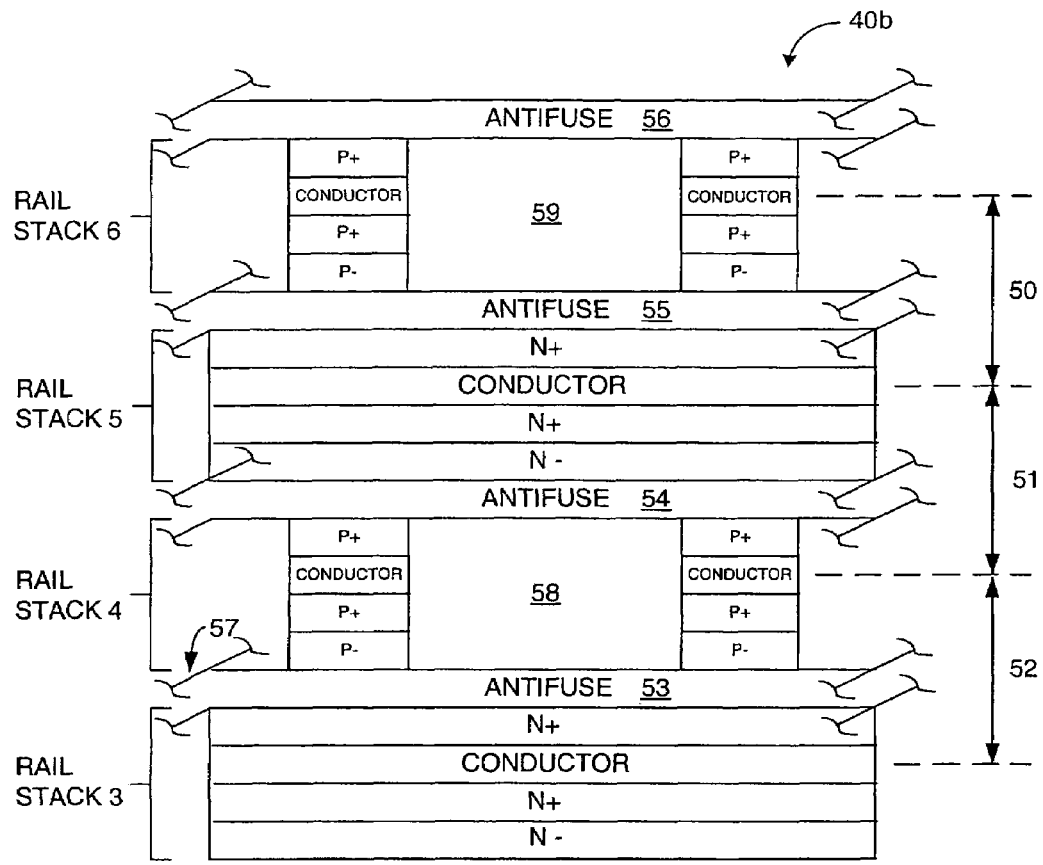
FIG. 5 is a cross-sectional view of one embodiment of a three-dimensional memory array.

FIG. 5 illustrates one embodiment of a three-dimensional memory array that may be included as first integrated circuit 40*b* in the memory module of the present invention. In FIG. 5, only three complete levels 50, 51, and 52 of the memory array are depicted for purposes of simplicity. However, the memory array may include additional levels above and/or below the levels shown. The memory array may also be fabricated on a substrate, which may include a plurality of conductors. Also, vias may connect conductors within the rail-stacks to trace conductors within the substrate to read (or write) data from (or to) the memory array. Furthermore, each of the memory array rail-stacks may be a full or half set, such that half rail-stacks may be approximately half the thickness of the full set of rail-stacks used in subsequent levels. In addition, insulating antifuse layers may be used to separate adjacent rail-stacks.

In FIG. 5, for instance, rail-stack 3 may be a full rail-stack including a lightly doped n− layer, a heavily doped n+ layer, a conductor layer, and a second n+ layer. The n+ layers may be formed above and below the conductor layer to prevent unintended Schottky diode formation. Antifuse layer 53 may be formed from a dielectric material, such as silicon dioxide, in one example, and may separate rail-stack 3 from neighboring rail-stack 4. Rail-stack 4 may be a half rail-stack formed above antifuse layer 53, and may include a lightly doped p− layer, a first p+ layer, a conductor layer, and a second p+ layer. After deposition, the layers of rail-stack 4 may be masked and etched to form the structures of half rail-stack 4. Lines 57 in FIG. 5 may indicate that antifuse layer 53 (and similar layers) may not be etched with the rail-stack and may extend over the entire array, thus reducing sidewall leakage into rail-stacks below.

The etching process may also form voids between portions of half rail-stacks, such as void 58 within rail-stack 4, which may be filled with a dielectric material. The fill may be planarized along with a portion of the second p+ layer to control the thickness and contour of the fill. Antifuse layer 54 may be deposited on top of rail-stack 4. The process may be repeated by forming rail-stacks 5 and 6 similar to the formation of rail-stacks 3 and 4, respectively, or until the 3-D memory array may be completed.

To write a bit into a cell of the 3-D memory array, a relatively high voltage (e.g. 5-20V) may be applied between the conductors of neighboring rail-stacks. Such a high voltage may cause a breach in the antifuse layer, thereby creating a diode at the intersection between rail-stacks. In this manner, each conductor may constitute a bit line for the "cells" above and below it. Conversely, the absence of such a voltage may permit the antifuse layer to retain its insulating properties. Therefore, diodes may be selectively formed to program the memory array by applying a voltage to select pairs of conductors. Similarly, data may be read from the 3-D memory array by applying a voltage that is substantially lower than the voltage used to write data into the array.

Alternative embodiments of the three-dimensional memory array may be further described in the above patent application. Additional embodiments may also be described in commonly owned U.S. Pat. No. 6,034,882 to Johnson et al, as set forth in paragraph one of this specification.

Figure 6:
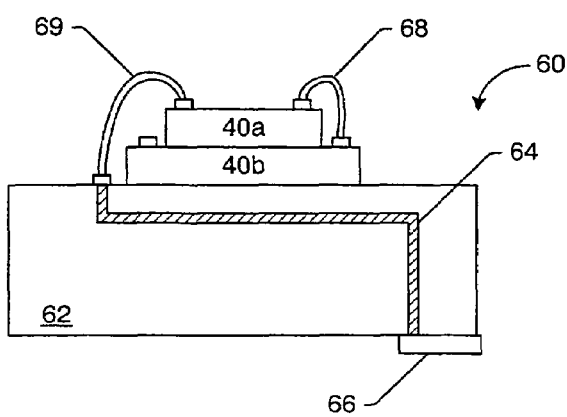
FIG. 6 is a perspective view of stacked integrated circuits, including a three-dimensional memory array, incorporated onto a substrate package.

FIG. 6 illustrates a first embodiment of the multi-chip module of the present invention in which stacked integrated circuits 40 may be incorporated onto substrate 62. Stacked integrated circuits 40 may include controller 40a and storage element 40b, such that controller 40a may be stacked upon and bonded to storage element 40b. In one example, controller 40a may also be electrically coupled to storage element 40b through a wire bonding process (i.e. wire bond 68). However, controller 40a may be coupled to storage element 40b by another bonding process, such as tape automated bonding (TAB) or flip-chip attachment. Preferably, storage element 40b may be a three-dimensional memory array, as described above.

Memory module 60 of FIG. 6 may also include a first set of wires 69 extending between controller 40a and trace conductors 64. Trace conductors 64 may be arranged on the surface of substrate 62 and/or embedded within the thickness of substrate 62. Trace conductors 64 may, therefore, include one or more layers of trace conductors, each of which may be separated by a dielectric layer. Trace conductors 64 may extend along one or more of layers of the substrate, and may connect leads of at least one integrated circuit to a plurality of conductors 66 through plated-through holes, or vias.

The memory module may further include a molded resin encasing stacked integrated circuits 40 and substrate 62, such that the memory module may include an outer surface having dimensions substantially equal to the dimensions of a conventional memory card. The plurality of conductors 66 may also be shaped similar to edge connectors of a conventional memory card, and may be arranged in a single row near a forward leading edge of memory module 60. Additionally, the row of conductors 66 may extend flush with, or possibly extend slightly above or below, the outer surface of the molded memory module. In this manner, memory module 60 may be inserted into a receptor of an electronic device, such that the row of conductors (i.e. edge connectors) may be retained in surface contact with a corresponding planar conductive surface within the receptor.

Figure 7:
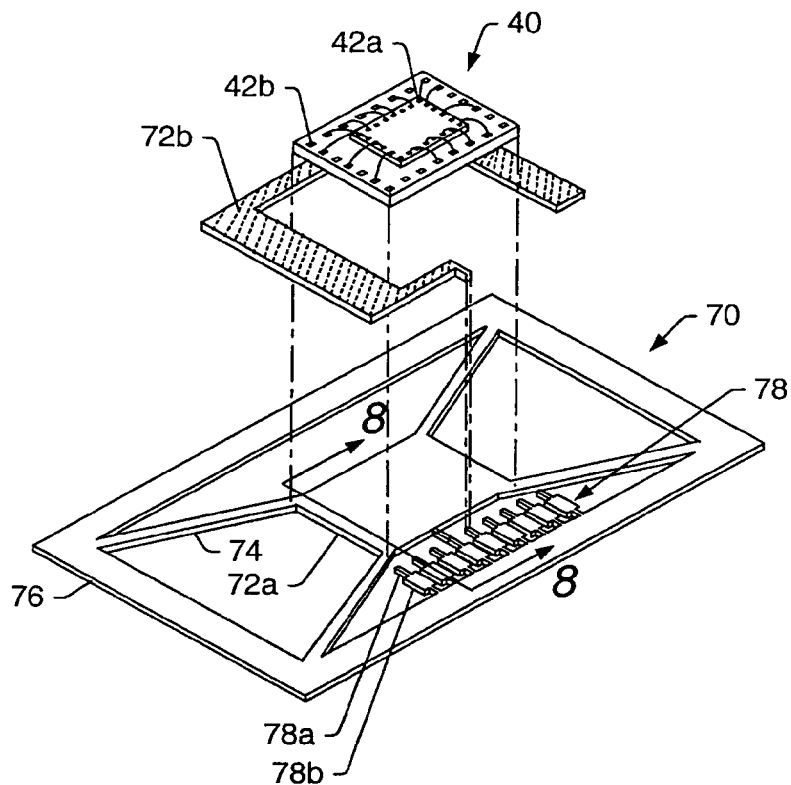
FIG. 7 is a perspective view of stacked integrated circuits incorporated onto a lead frame package.

FIG. 7 illustrates a second embodiment of the multi-chip module of the present invention in which stacked integrated circuits 40 may be incorporated onto lead frame 70. In one example, first integrated circuit 40b may be a three-dimensional memory array, as described above. However, the scope of the present invention may include any storage element, or any other integrated circuit. Lead frame 70 may contain a first portion 72 (i.e. paddle) that may be configured below stacked integrated circuits 40. Integrated circuits 40 may be bonded to the first portion of lead frame using, for example, a die attach adhesive. The die attach adhesive may be tape or epoxy based. As such, lead frame 70 may serve to support the molded memory module, and thus, may be fabricated from a strip of sheet metal by stamping or chemical milling. Lead frame 70 may also provide a holding fixture during the assembly process in which bonding pads 42 of integrated circuits 40 may be connected to the lead frame. After molding, lead frame 70 may become an integral part of the memory module. The lead frame may be fabricated from numerous materials, including nickel-iron or copper alloy. The lead frame may also be layered as a composite strip, such that a copper alloy may be placed upon a stainless steel structure. The lead frame, however, may be conductive. Conversely, a conventional substrate (or printed circuit board/card) may not be conductive, but may be instead semiconductive with layers of non-conductive dielectric interspersed with layers of spaced apart trace conductors.

Extending outward from first portion 72 of lead frame 70 may be support members 74. Support members 74 may thereby secure the position of first portion 72 relative to a frame 76 encircling first portion 72. Extending inward from one side of frame 76 may be a plurality of conductors 78. Each conductor 78 may include a first portion 78a and a second portion 78b. First portion 78a may be relatively narrow in upper surface area, while second portion 78b may be much wider. Portions 78a and 78b may be formed from a single piece of conductive material and may extend as an integral piece with items 72, 74 and 76. Thus, first portion 72, support members 74, frame 76, and conductors 78 may be formed from the same sheet, such that each item may be stamped from that sheet.

Figure 8:
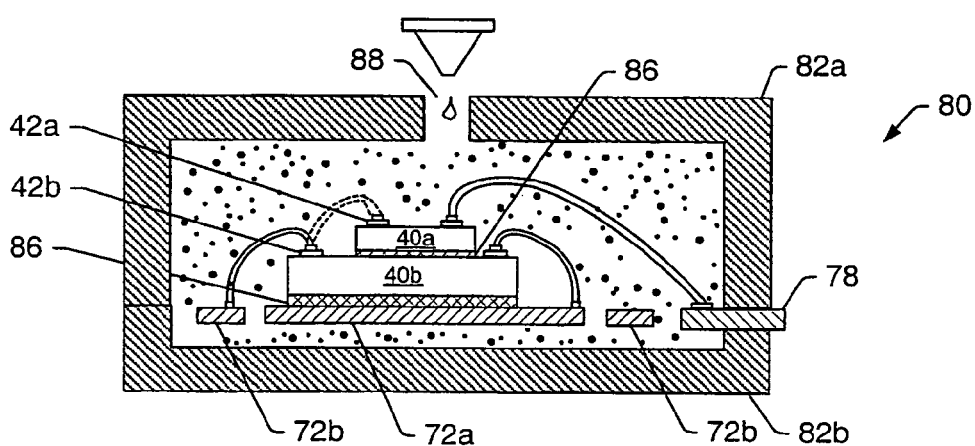
FIG. 8 is a cross sectional view along plane 8 of FIG. 7, with a first integrated circuit coupled to a conductive ring and to the paddle portion of the lead frame, the second integrated circuit coupled to the edge connectors of the lead frame, and a pair of mold housings suspended around the stacked integrated circuits such that resin may be poured into the space between the mold housings and the integrated circuits.

FIG. 8 illustrates a cross sectional view along plane 8 of FIG. 7 after bonding stacked integrated circuits 40 to first portion 72 of lead frame 70. For example, a first integrated circuit 40b, such as a semiconductor memory, may be bonded to first portion 72 using a die attach adhesive 86. Die attach adhesive 86 may include silicon/gold eutectic bonding or may use a polymer adhesive base. Alternatively, die attach adhesive 86 may include any structure that securely fastens stacked integrated circuits 40 to first portion 72. In any case, die attach adhesive 86 is not electrically conductive, however, adhesive 86 may include thermal conducting properties.

A second integrated circuit 40a, such as a controller, may then be stacked upon and bonded to an opposing surface of the first integrated circuit using die attach adhesive 86. In another example, a memory die may be stacked upon a controller die, or any other combination of two or more integrated circuits may be used to form a stack of integrated circuits. The individual die may be electrically coupled to one another through a wire bonding process, which may attach individual wires between the bonding pads of each die, such that communication between the die may be achieved. For example, bonding pads 42*b* of integrated circuit 40*b* may be wire bonded to bonding pads 42*a* of integrated circuit 40*a*, such that integrated circuits 40*a* and 40*b* may be electrically and mechanically coupled to one another.

In addition to being interconnected to integrated circuit 40*b*, integrated circuit 40*a* may also be coupled to a first set of the plurality of conductors 78. For example, a first set of wires may extend between bonding pads 42*a* of integrated circuit 40*a* and bonding pads arranged on first portion 78*a* of conductors 78. Conductors 78 may be adapted for frictional engagement with, and electrical connection to, conductive elements arranged within a receptor of an electronic device. In this manner, integrated circuit 40*a* may be coupled to internal circuitry of the electronic device.

A second set of wires may extend between first integrated circuit 40*b* and first portion 72, such that the second set of wires may only transmit power and ground signals to integrated circuit 40*b*. The first portion of the lead frame may be laterally coupled to a second set of the plurality of conductors 78. In this manner, the first portion may be adapted to couple at least one of the stacked integrated circuits to dedicated power and ground conductors (i.e. second set of the plurality of conductors) from among conductors 78. As such, first portion 72 may include power and ground planar elements. The power element may extend as conductive ring 72*b* coplanar with and laterally spaced from the ground element (such that the ground element 72*a* may be the paddle portion of the lead frame structure). Conductive ring 72*b* may be separated from ground element 72*a* by an air gap on all four sides of ground element 72*a*. In this manner, conductive ring 72*b* may be electrically isolated from ground element 72*a* in subsequent processing steps (i.e. when encapsulated with mold compound).

Furthermore, a first one of the second set of conductors may be adapted to connect conductive ring 72*b* to a power signal (or any other signal). Similarly, a second one of the second set of conductors may be adapted to connect ground element 72*a* to a ground signal (or any other signal). Alternatively, ground element 72*a* may be adapted to transmit a power signal and conductive ring 72*b* may be adapted to transmit a ground signal. Moreover, first portion 72 may extend flush with or beyond the outer dimension of the stacked integrated circuits. In this manner, first portion 72 may be adapted to couple power and ground signals to bonding pads on any side of an integrated circuit. Alternatively, first portion 72 may be adapted to couple any two bonding pads of conductors 78 to bonding pads on any side of an integrated circuit. Therefore, the above embodiments of the present invention may provide a means to couple one or more stacked integrated circuits to lead frame conductors with the capability to utilize bonding pads on all four sides of an integrated circuit.

FIG. 8 also indicates that once conductors 78 of lead frame 70 are secured and electrically connected to corresponding bonding pads on integrated circuit 40*a*, conductors 78 may be retained between a pair of mold housings 82, and liquid resin 88 may be injected into the air-filled space surrounding integrated circuit 40*a*. Contrary to ceramic packaging techniques which may leave an air-filled space between the integrated circuit and the package inner surface, the present technique purposely fills that space with an encapsulate that also suffices as the memory module encasement. Thus, after removing the pair of mold housings 82, the resin may extend outward from the integrated circuit to form an outer surface of memory module 80.

The resin may be any inert component that is not electrically conductive, yet may include some thermal conductive properties. For example, the resin may consist of silicones, phenolics, and bisphenols (epoxy). The resin may also contain various curing agents, hardeners, accelerators, inert fillers, coupling agents, flame-retardants, stress-relief additives, coloring agents, and mold-release agents. In whatever form, resin 88 may be injected in liquid form into the cavity between the inward-facing surfaces of mold housings 82. After the liquid resin has had sufficient time to cure, the resin may harden to the form and dimensions of a conventional memory card.

Figure 11:
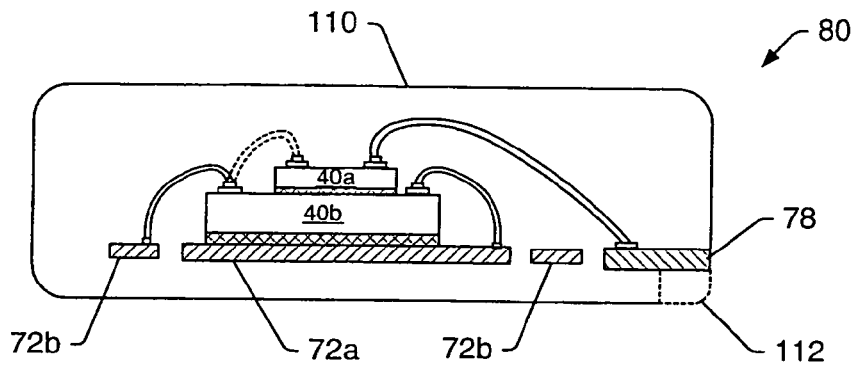
FIG. 11 is a cross-sectional view along plane 8 of FIG. 7 after the mold housings and a portion of the hardened resin has been removed to expose edge connectors arranged in a row along the backside of the memory module.

FIG. 11 illustrates memory module 80 after removal of the pair of mold housings 82. Memory module 80 may be formed of hardened resin material 110, which may encompass integrated circuits 40 and conductors 78. The hardened resin may serve to protect integrated circuits 40 from ingress of moisture, and may provide a mechanical support for the integrated circuits.

Figure 2:
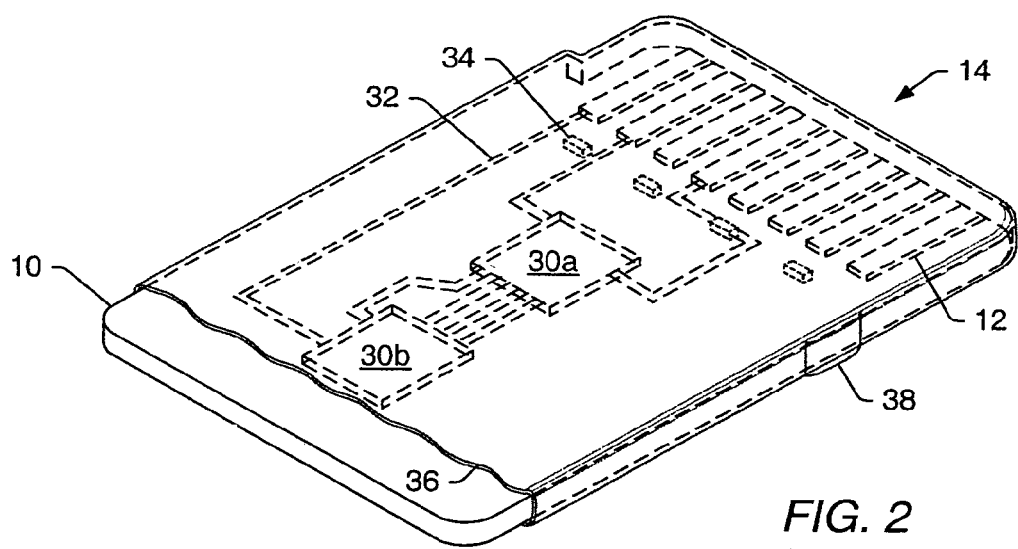
FIG. 2 is a perspective view of the memory card in FIG. 1 with packaged integrated circuits mounted upon a rigid printed circuit board and encased in a covering.
Figure 3:
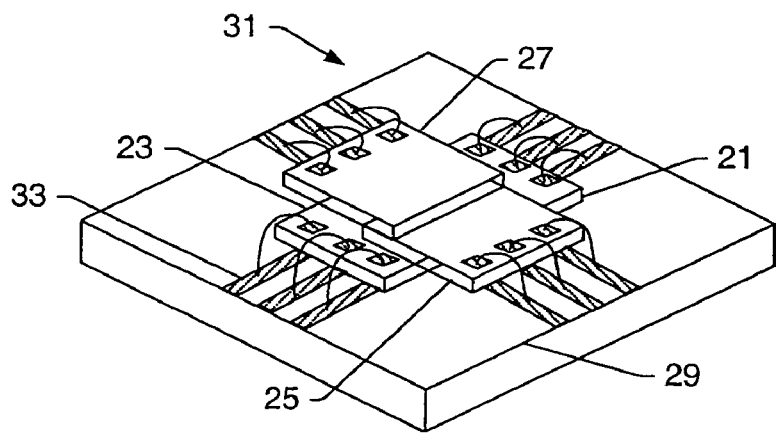
FIG. 3 discloses a multi-chip module mounted on a substrate base bearing trace conductors.

After resin 110 has hardened, a covering 120 may be placed around the hardened resin. For example, covering 120 may be made of plastic that is heat-shrunk to fit the outer dimensions of the molded resin, or may be glued or welded at the joint between a two-part assembly of the covering. Memory card 80 may, therefore, be formed either with or without covering 120. If covering 120 is present, however, a mechanical switch or tab may be formed within the covering, similar to item 38 shown in FIG. 2. Thus, mechanical tab 38 may prevent writing data to integrated-circuits 40 when mechanical tab 38 is activated. Alternatively, the switch may be snap assembled to slots formed in resin 110.

Regardless of whether a covering is used, the hardened resin may be partially removed to expose the outer planar surfaces of conductors 78. Removal may take place either by back-lapping or etching of the molded resin to expose conductors 78 as the edge connectors of the memory module. Beneficially, the removal process may be employed on the backside surface of the memory module near the forward-leading edge, so that the forward-leading edge may be inserted into a receptor bearing corresponding conductive elements. Alternatively, the molding process may leave the pad areas free of resin, for example, by forming the mold cavity so that a recess may be formed to expose conductors 78, thereby forming edge connectors. The hardened resin 110 may or may not be encircled by a covering and, as shown in FIG. 11, no covering need be present.

Figure 12:
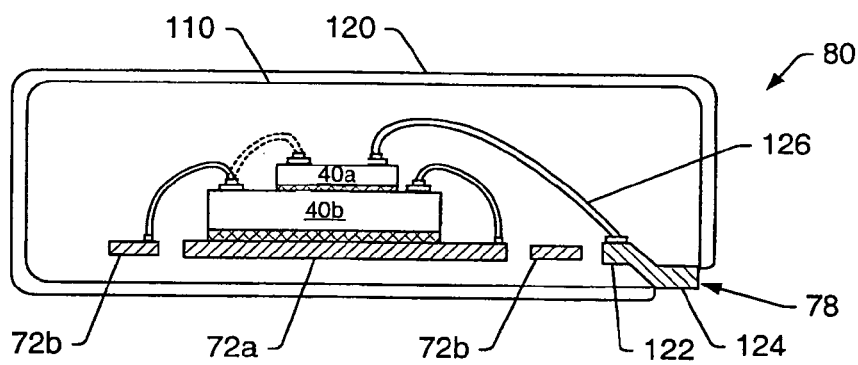
FIG. 12 is a cross-sectional view of an alternative configuration in which the edge connectors may be bent downward to form a conductive surface that is flush with the outer surface of the memory module.

FIG. 12, however, illustrates the use of covering 120 and, more importantly, depicts a bend placed in conductors 78 of the lead frame. Conductors 78 may thereby be shown with a first part 122. First part 122 may be substantially coplanar with first portion 72 of the lead frame, and may be adapted to receive a wire bond of wire 126. Conductors 78, therefore, may extend along a first plane substantially coplanar to first portion 72, and may further extend downward at an angle to a second plane at which second part 124 may reside. Second part 124 may have an outer surface that may extend flush with the outer surface of hardened resin 110. As such, second part 124 may be exposed at the forward-leading edge of memory module 80. By employing a bend within conductors 78, no back-lapping or etching of hardened resin material 110 may be necessary to expose the edges of conductors 78. Additionally, second part 124 may consist of a widened surface (see FIG. 7) that may be adapted to frictionally engage conductive elements within a receptor of an electronic device, in one example. In this manner, bending one or more conductors within the row of conductors 78 may expose the second part 124 of each conductor. Thus, bending the conductors in the above manner may substantially form a row of edge connectors at the forward-leading edge of memory module 80. The edge connectors may be slightly offset from each other along a single axis. Even though one or more edge connectors within a row may be offset from the axis, the edge connectors nonetheless may maintain somewhat of an alignment along a line relative to one another. First portion 72, conductive ring 79, and integrated circuits 40, however, may remain suspended entirely within hardened resin 110.

Figure 13:
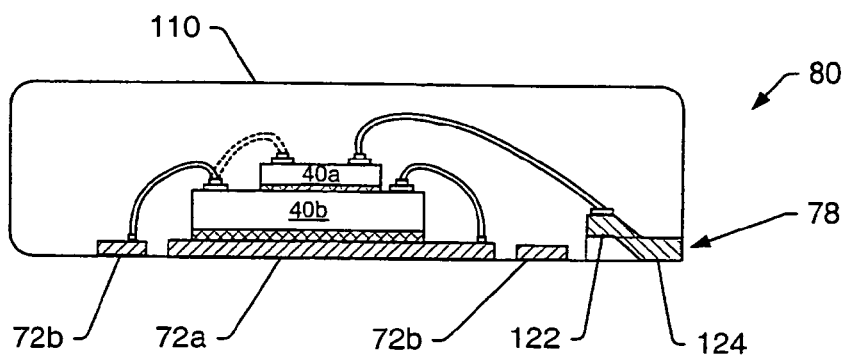
FIG. 13 is a cross-sectional view of another alternative configuration in which the lead frame paddle may lie along the same plane as the exposed edge connectors in order to provide a thermal sink.

FIG. 13 illustrates an alternative arrangement of the second embodiment, in which first part 122 of conductors 78 may be arranged in a plane above first portion 72. Unlike the arrangement of FIG. 12 in which first part 122 may be coplanar with first portion 72, the first part 122 of FIG. 13 may be arranged above the plane formed by first portion 72, such that second part 124 may be coplanar with first portion 72. FIG. 13, therefore, illustrates elevating conductors 78 above first portion 72 to not only expose second part 124 as an edge connector, but also to expose the backside surface of first portion 72. Recall that first portion 72 may be conductive elements, and that die adhesive 86 may be thermally conductive. Each arrangement, therefore, may allow any heat build-up within integrated circuit 40b to be transferred downward to thermally conductive elements 86 and 72. As such, the thermally conductive first portion 72 may operate as a heat sink to remove heat from integrated circuit 40b. In another example, conductors 78 may extend in a single plane, as depicted in FIG. 11, such that conductors 78 may be exposed as edge connectors.

Figure 14:
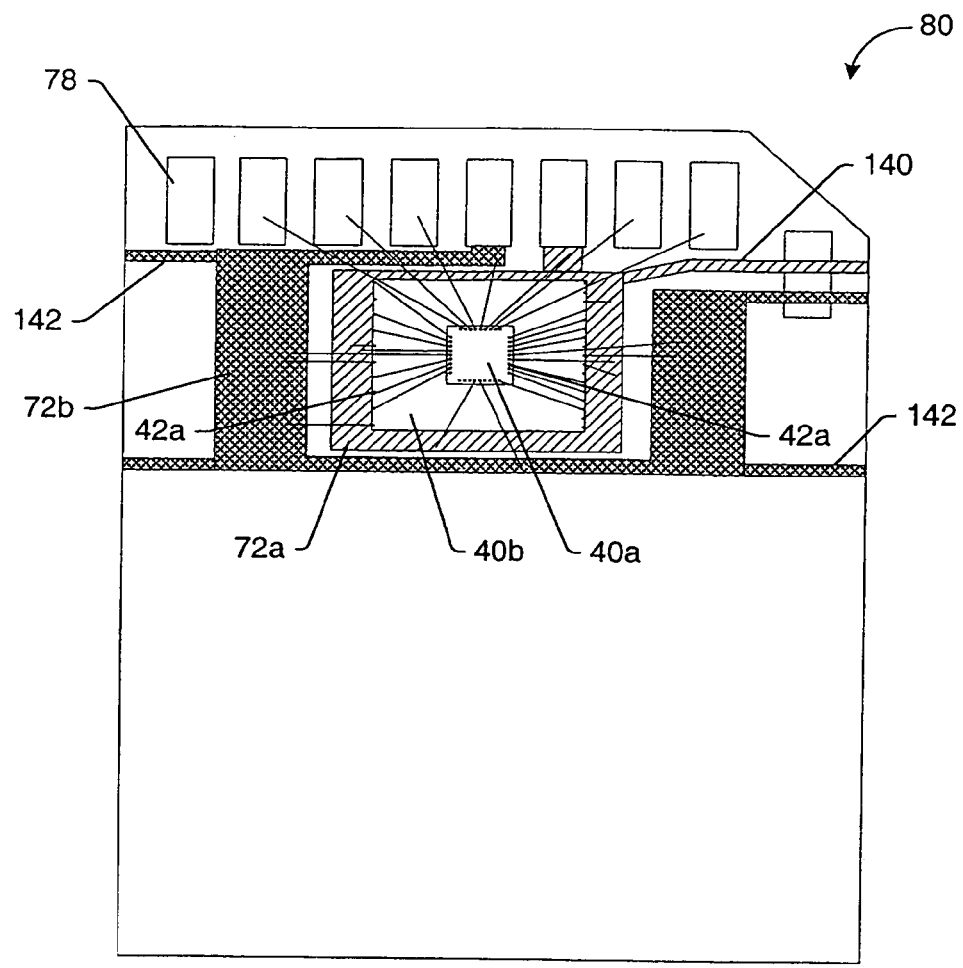
FIG. 14 is cross-sectional view along a lateral plane of the first embodiment illustrating how power and ground signals may be transmitted to the stacked integrated circuits on all four sides of the integrated circuits.

FIG. 14 is top plane view along a lateral plane of the memory card as described in the second embodiment of the present invention. Thus, FIG. 14 illustrates the manner in which power and ground signals may be transmitted to stacked integrated circuits on all four sides of the integrated circuits. Memory card 80, therefore, may include integrated circuit 40a stacked upon and bonded to integrated circuit 40b. Each of the integrated circuits 40 may have an upper active surface that may include bonding pads 42 arranged along all four sides of the active surface. In this manner, bonding pads 42a of integrated circuit 40a may be coupled to bonding pads 42b of integrated circuit 40b, such that bonding pads may be utilized on all four sides of the integrated circuits.

In addition, memory card 80 may include a plurality of conductors 78 that may be arranged on a forward-leading edge of the memory module. Memory card 80 may also include a molded resin extending completely around the stacked integrated circuits to form an outer dimension of the memory module. Subsequently, conductors 78 may be exposed in a manner as described above, thereby forming a row of edge connectors on the forward-leading edge of the memory card. Memory card 80 may further include a lead frame, in which first portion 72 of the lead frame may extend beyond the outer dimensions of integrated circuits 40. A first set of the plurality of conductors may be spaced laterally from first portion 72, while a second set of the plurality of conductors may be laterally coupled to first portion 72. In this manner, first portion 72 may be adapted to electrically couple integrated circuits 40 to the second set of edge conductors 78. First portion 72 may also be mechanically coupled to the lead frame with support members 140 and 142. Support members 140 and 142 are arranged on a lateral plane separate from conductors 78, such that support members 140 and 142 may be dielectrically spaced and electrically isolated from conductors 78.

As stated above, first portion 72 may include power and ground planar elements. The power element may extend as conductive ring 72b coplanar with and laterally spaced from ground element 72a. As such, conductive ring 72b may be separated from ground element 72a by an air gap on all four sides of ground element 72a. In this manner, conductive ring 72b may be electrically isolated from ground element 72a by filling the air gap with mold compound during the encapsulation of the memory module. As such, ground element 72a and conductive ring 72b may be adapted to couple integrated circuits 40 to at least a portion of conductors 78, such that bonding pads 42 may be utilized on all four sides of integrated circuits 40.

Thus, ground element 72a may be adapted to couple a ground signal from a first conductor of the second set of conductors 78 to a bonding pad on any of the four sides of an integrated circuit. Similarly, conductive ring 72b may be adapted to couple a power signal from a second conductor of the second set of conductors 78 to a bonding pad on any of the four sides of an integrated circuit. In an alternative example, ground element 72a may be adapted to transmit a power signal and conductive ring 72b may be adapted to transmit a ground signal. Furthermore, first portion 72 may be adapted to couple any two conductors of the plurality of conductors 78 to bonding pads on any side of an integrated circuit.

Figure 9:
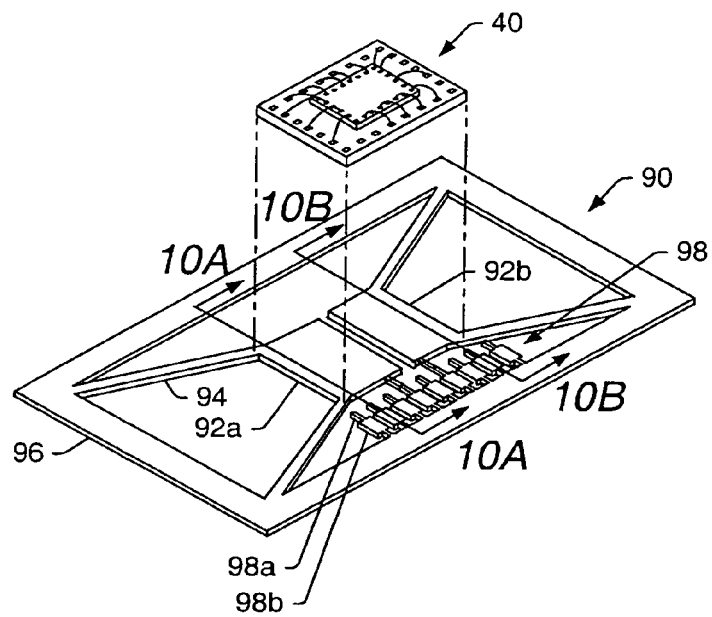
FIG. 9 is a perspective view of stacked integrated circuits incorporated onto a lead frame package having a bifurcated paddle, according to a second embodiment.

FIG. 9 illustrates yet another embodiment of the multi-chip module of the present invention in which stacked integrated circuits 40 may be incorporated onto lead frame 90. Lead frame 90 may be configured similarly to lead frame 70 of FIG. 7, such that lead frame 90 may include first portion 92, support members 94, frame 96, and conductors 98. Conductors 98 may also include first portion 98a and second portion 98b, similar in configuration to conductors 78 of lead frame 70 (shown in FIG. 7). Thus, first portion 92, support members 94, frame 96, and conductors 98 may be formed from the same sheet, such that each item may be stamped from that sheet.

Additionally, first portion 92 of lead frame 90 may be configured to receive a first integrated circuit 40b. A second integrated circuit 40a may also be stacked upon and coupled to the first integrated circuit. In one example, first integrated circuit 40b may be a three-dimensional memory array, as described above. However, the scope of the present invention may include any other storage element or integrated circuit. For instance, first integrated circuit 40b may be a semiconductor memory while second integrated circuit 40a may be a controller. Alternatively, memory may be stacked upon and coupled to a controller, or any other combination of two or more integrated circuits may also be used to create such a stacked configuration. However, unlike lead frame 70, first portion 92 of lead frame 90 may be further separated into first and second coplanar elements 92a and 92b, respectively.

As stated above, the second portion of lead frame 90 may include a plurality of conductors 98, such that a first conductor from among the plurality of conductors may extend toward and connect with first coplanar element 92a of the first portion. Likewise, a second conductor from among the plurality of conductors 98 may extend toward and connect with second coplanar element 92b of the first portion. In this manner, the first conductor may transmit a power signal to first coplanar element 92a, while the second conductor may transmit a ground signal to second coplanar element 92b. In an alternative example, the first conductor may transmit a ground signal to the first coplanar element, while the second conductor may transmit a power signal to the second coplanar element. In yet a further example, the first and second conductors may transmit any two signals that may be necessary to the functionality of integrated circuits 40. In any case, all other of the first set of conductors 98, except for the first one and second one, may be spaced from the first portion.

Figure 10A:
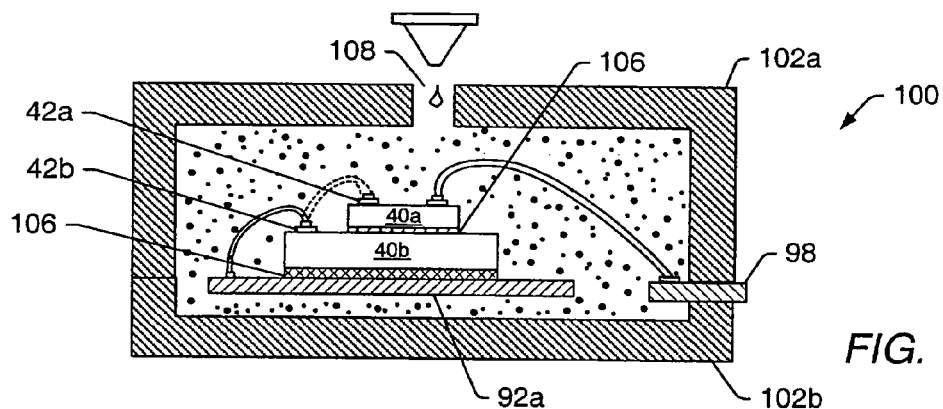
FIG. 10A is a cross sectional view along plane 10A of FIG. 9, depicting the stacked integrated circuits bonded to the first element of the bifurcated paddle, and a pair of mold housings suspended around the stacked integrated circuits such that resin may be poured into the space between the mold housings and the integrated circuits.
Figure 10B:
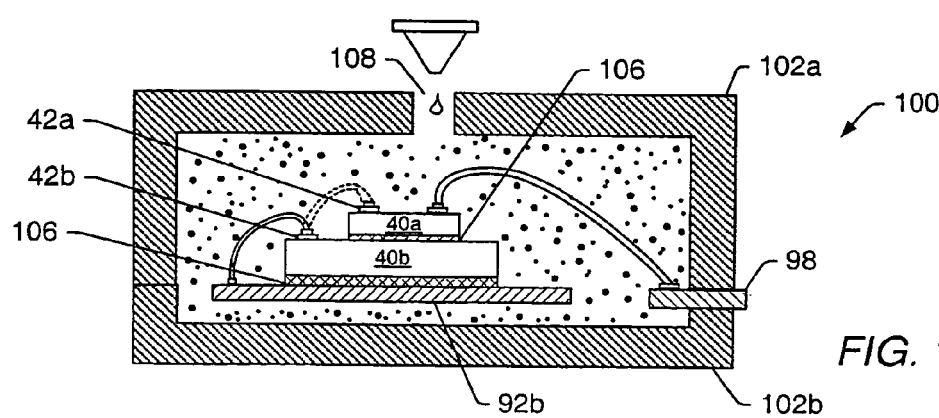
FIG. 10B is a cross sectional view along plane 10B of FIG. 9, depicting the stacked integrated circuits bonded to the second element of the bifurcated paddle, and a pair of mold housings suspended around the stacked integrated circuits such that resin may be poured into the space between the mold housings and the integrated circuits.

FIGS. 10A and 10B illustrate cross sectional views along planes 10A and 10B of FIG. 9 after bonding stacked integrated circuits 40 to first portion 92 of lead frame 90. Plane 10A is a cross sectional view of FIG. 9 including first coplanar element 92*a*, illustrating the coupling between integrated circuit 40*b* and first coplanar element 92*a*. Similarly, plane 10B is a cross sectional view of FIG. 9 including second coplanar element 92*b*, illustrating the coupling between integrated circuit 40*b* and second coplanar element 92*b*.

In either case, a first integrated circuit 40*b*, such as a memory die, may be bonded to first portion 92 in such a manner as to bond integrated circuit 40*b* with at least a portion of each of the first and second coplanar elements (i.e. bifurcated paddle) of the lead frame. Die attach adhesive 106 may be used to bond integrated circuit 40*b* to first portion 92. Die attach adhesive 106 may include silicon/gold eutectic bonding or may use a polymer adhesive base. Alternatively, die attach adhesive 106 may include any structure that securely fastens integrated circuit 40*b* to first portion 92. As stated above, though die attach adhesive 106 may not be electrically conductive, die attach adhesive 106 may include thermal conducting properties.

A second integrated circuit 40*a* may be stacked upon and bonded to an opposing surface of the first integrated circuit using die attach adhesive 106. The individual die may be electrically coupled to one another through a wire bonding process, which may attach individual wires between the bonding pads of each die, such that communication between the die may be achieved. For example, bonding pads 42*b* of integrated circuit 40*b* may be wire bonded to bonding pads 42*a* of integrated circuit 40*a*, such that integrated circuits 40*a* and 40*b* may be electrically and mechanically coupled to one another.

In addition to being interconnected to integrated circuit 40*b*, integrated circuit 40*a* may also be coupled to the plurality of conductors 98. For example, a first set of wires may extend between bonding pads 42*a* of integrated circuit 40*a* and bonding pads arranged on a first portion 98*a* of conductors 98. In this manner, integrated circuit 40*a* may be coupled to internal circuitry of an electronic device via conductors 98, such that conductors 98 may be adapted for frictional engagement with, and electrical connection to, conductive elements arranged within a receptor of the electronic device.

Furthermore, first portion 92 may be a bifurcated conductive plate, such that the first and second coplanar elements 92*a*, 92*b* of the first portion may be adapted to transmit power and ground signals. The bifurcated paddle, or first portion 92, may also be adapted to extend beyond the dimensions of the stacked integrated circuits. In this manner, first coplanar element 92*a* may extend beyond the lateral extents of a first portion of the stacked integrated circuits. Similarly, second coplanar element 92*b* may extend beyond the lateral extents of a second portion of the stacked integrated circuits. Thus, the bifurcated paddle of the lead frame may be adapted to connect power and ground signals from conductors 98 to bonding pads of integrated circuits 40 on any side of the integrated circuits. For example, first coplanar element 92*a* may be connected by a first conductor of conductors 78 to a ground signal (or power signal), while second coplanar element 92*b* may be connected by a second conductor of conductors 78 to a power signal (or ground signal).

After coupling the stacked integrated circuits to each other, first portion 92, and conductors 98, the memory module of the present embodiment may be completed in the manner as described in FIGS. 8 and 11-13. Specifically, conductors 98 may be retained between a pair of mold housings 102, and liquid resin 108 may be injected into the air-filled space surrounding integrated circuits 40. Since first coplanar element 92*a* may be laterally spaced from second coplanar element 92*b*, the liquid resin injected into the mold cavity may fill the common space to electrically isolate the two coplanar elements. Liquid resin 108 may harden, and subsequently, the pair of mold housings 102 may be removed. In this manner, the resin may extend outward from the stacked integrated circuits to form an outer surface of memory module 100, such that memory module 100 may exhibit the form and dimensions of a conventional memory card. The hardened resin may also serve to protect integrated circuits 40 from ingress of moisture, and may further provide a mechanical support for the integrated circuits.

The molded resin may be partially removed by a backlapping or etching process to expose conductors 98 as the edge connectors of memory module 100. Alternatively, a bend may be employed within conductors 98, such that backlapping or etching of the molded resin may not be necessary to expose the edges of conductors 98. Thus, conductors 98 may substantially form a row of edge connectors at the forward-leading edge of memory module 100.

In an alternative arrangement of the present embodiment, conductors 98 may be elevated above first portion 92 to expose a second part of conductor 98 as an edge connector, as well as to expose the backside surface of first portion 92. In such an arrangement, any heat build-up within integrated circuit 40*b* may be transferred downward to the thermally conductive adhesive 106 and first portion 92. As such, the thermally conductive first portion 92 may operate as a heat sink to remove heat from integrated circuit 40*b*. In an alternative example of the present arrangement, conductors 98 may extend along a common plane with first portion 92, such that the backside surfaces of conductors 98 and first portion 92 may be exposed.

It will be appreciated to those skilled in the art having the benefit of this disclosure that the details provided herein ate believed to denote a memory module that may be mounted on a substrate or lead frame of a memory card package and may include one or more stacked integrated circuits. The memory module of the present invention may also provide a means to couple one or more of the stacked integrated circuits to substrate or lead frame conductors with the capability to utilize bonding pads on all four sides of the integrated circuits. The improved memory module may have further modifications and alternative forms to include various aspects of the present invention, as will be apparent to those skilled in art after having reviewed this description. Thus, it is intended that the following claims be interpreted to embrace all such modifications and changes and, accordingly, the specification and drawings are to be regarded in an illustrative rather than restrictive sense.

What is claimed is:

1. A memory module, comprising:
   a multi-level array of storage cells;
   a controller electrically coupled to the array of storage cells via one or more wires, each of which extends between a bonding pad formed on the controller and a respective bonding pad formed on the array of storage cells;
   a substrate comprising a plurality of conductors which terminate along a linear axis near a single edge of the memory module; and
   means for connecting the controller and/or the array of storage cells to the plurality of conductors.

2. The memory module as recited in claim 1, wherein the storage cells are spaced vertically above the substrate and comprises a first plurality of spaced-apart rail-stacks separated by one or more insulating layers from a second plurality of spaced-apart rail-stacks, wherein the second plurality of rail-stacks is arranged in a direction perpendicular to the first plurality of rail-stacks.

3. The memory module as recited in claim 1, wherein the means for connecting comprises wire bonding.

4. The memory module as recited in claim 1, wherein the means for connecting comprises tape automated bonding.

5. The memory module as recited in claim 1, wherein the means for connecting comprises flip chip bonding.

6. The memory module as recited in claim 1, wherein the controller and the array of storage cells are arranged in a stacked configuration with one stacked on top of, and bonded to, the other.

7. The memory module as recited in claim 6, wherein the controller is stacked on top of, and bonded to, the array of storage cells.

8. The memory module as recited in claim 6, wherein the array of storage cells is stacked on top of, and bonded to, the controller.

9. The memory module as recited in claim 6, wherein the controller and the array of storage cells each comprise a plurality of active bonding pads, the active bonding pads being distributed along at least two sides of one surface thereof.

10. The memory module as recited in claim 9, wherein the plurality of active bonding pads are distributed along all four sides of the surface.

11. The memory module as recited in claim 9, wherein the stacked configuration and the distribution of active bonding pads enables the controller and the array of storage cells to be electrically coupled to one another on two or more sides of the controller and the array of storage cells.

* * * * *